United States Patent
Wu et al.

(10) Patent No.: US 12,272,551 B2
(45) Date of Patent: Apr. 8, 2025

(54) SELECTIVE METAL REMOVAL WITH FLOWABLE POLYMER

(71) Applicant: Applied Materials, Inc., Santa Clara, CA (US)

(72) Inventors: Liqi Wu, San Jose, CA (US); Feng Q. Liu, San Jose, CA (US); Bhaskar Jyoti Bhuyan, San Jose, CA (US); James Hugh Connolly, Dublin (IE); Zhimin Qi, Fremont, CA (US); Jie Zhang, Sunnyvale, CA (US); Wei Dou, Santa Clara, CA (US); Aixi Zhang, Sunnyvale, CA (US); Mark Saly, Santa Clara, CA (US); Jiang Lu, Milpitas, CA (US); Rongjun Wang, Dublin, CA (US); David Thompson, San Jose, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 434 days.

(21) Appl. No.: 17/824,889

(22) Filed: May 25, 2022

(65) Prior Publication Data

US 2023/0386833 A1  Nov. 30, 2023

(51) Int. Cl.
*H01L 21/027* (2006.01)
*C23C 14/16* (2006.01)
*H01L 21/3213* (2006.01)
*H01L 21/768* (2006.01)

(52) U.S. Cl.
CPC .......... *H01L 21/0271* (2013.01); *C23C 14/16* (2013.01); *H01L 21/32139* (2013.01); *H01L 21/76816* (2013.01); *H01L 21/76831* (2013.01); *H01L 21/76877* (2013.01)

(58) Field of Classification Search
None
See application file for complete search history.

(56) References Cited

U.S. PATENT DOCUMENTS

| 4,847,214 | A | * | 7/1989 | Robb | H01L 21/763 |
| | | | | | 438/386 |
| 6,074,567 | A | * | 6/2000 | Kuraishi | H01L 21/4846 |
| | | | | | 257/E23.189 |

(Continued)

FOREIGN PATENT DOCUMENTS

JP    H05152250 A    6/1993

OTHER PUBLICATIONS

PCT International Search Report and Written Opinion in PCT/US2022/036698 mailed Feb. 23, 2023, 9 pages.

*Primary Examiner* — Allan W. Olsen
(74) *Attorney, Agent, or Firm* — Servilla Whitney LLC

(57) ABSTRACT

Embodiments of the disclosure relate to methods for selectively removing metal material from the top surface and sidewalls of a feature. The metal material which is covered by a flowable polymer material remains unaffected. In some embodiments, the metal material is formed by physical vapor deposition resulting in a relatively thin sidewall thickness. Any metal material remaining on the sidewall after removal of the metal material from the top surface may be etched by an additional etch process. The resulting metal layer at the bottom of the feature facilitates selective metal gapfill of the feature.

23 Claims, 6 Drawing Sheets

(56) References Cited

U.S. PATENT DOCUMENTS

| | | | |
|---|---|---|---|
| 7,960,273 B2* | 6/2011 | Lee | .................. H01L 21/76885 |
| | | | 438/637 |
| 2009/0140429 A1 | 6/2009 | Lee et al. | |
| 2012/0139112 A1 | 6/2012 | Bchir et al. | |
| 2018/0130707 A1 | 5/2018 | Clendenning et al. | |
| 2018/0233350 A1 | 8/2018 | Tois et al. | |
| 2019/0011424 A1* | 1/2019 | McRuer | ........... G01N 33/48721 |
| 2019/0109004 A1* | 4/2019 | Huang | .............. H01L 21/02507 |
| 2019/0139917 A1* | 5/2019 | Lu | ....................... H01L 23/3171 |
| 2020/0105515 A1 | 4/2020 | Maes et al. | |
| 2021/0384035 A1 | 12/2021 | Fisher et al. | |

* cited by examiner

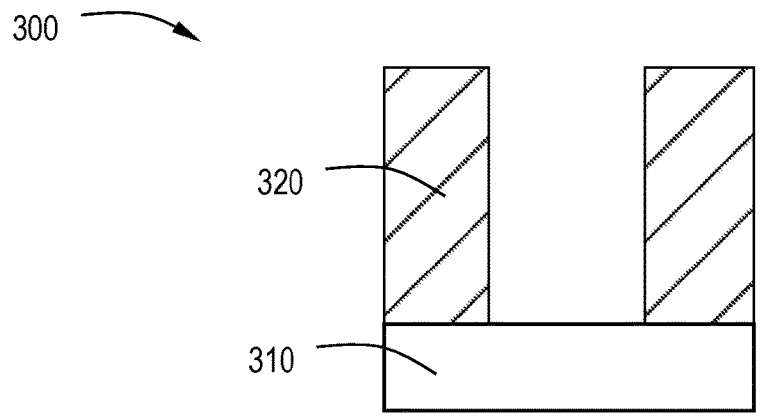
FIG. 3
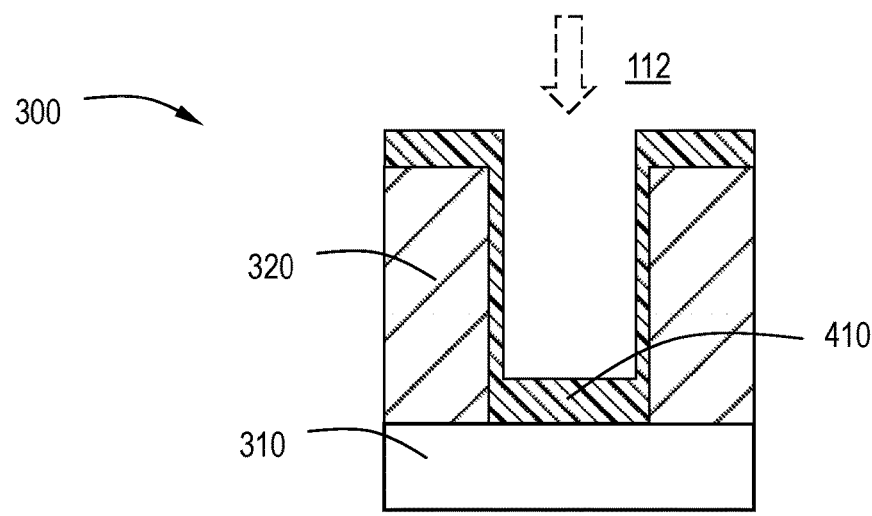
FIG. 4
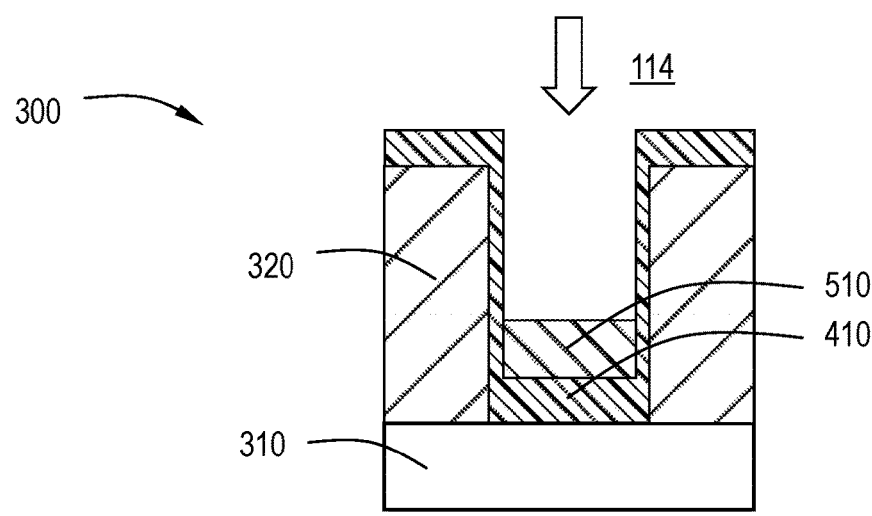
FIG. 5
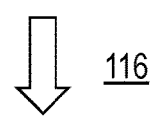

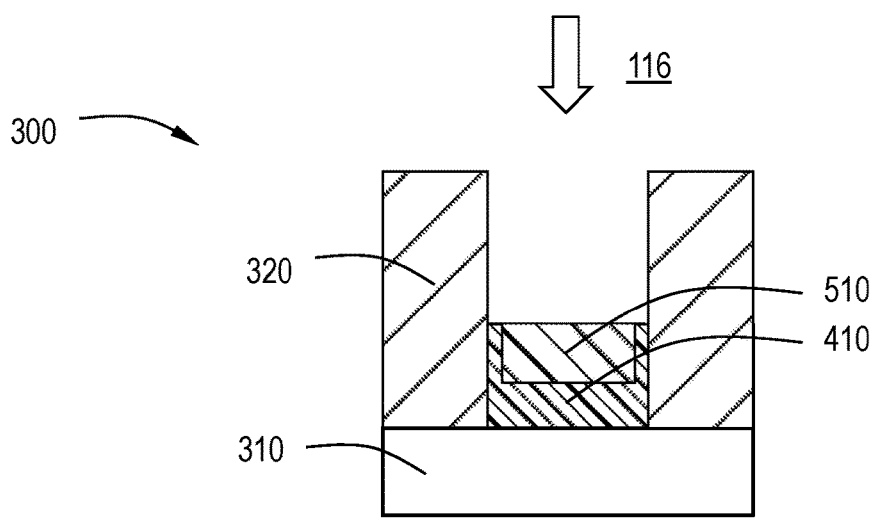
FIG. 6
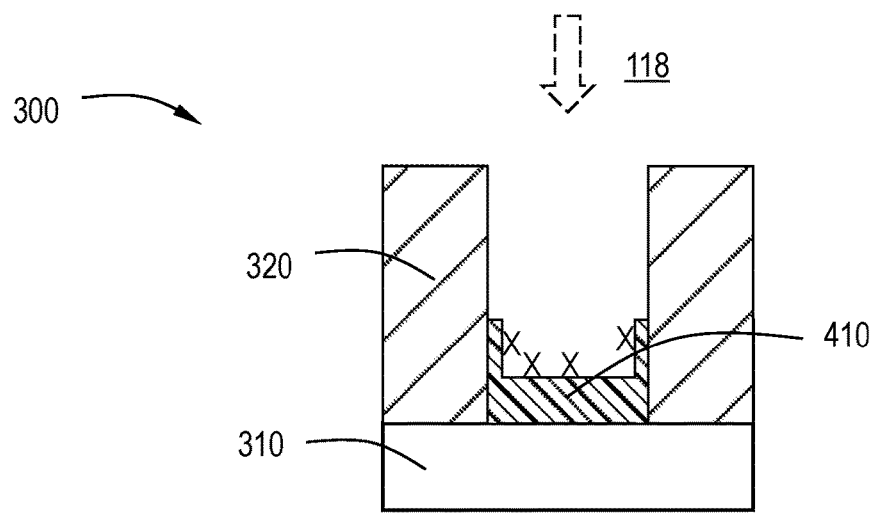
FIG. 7
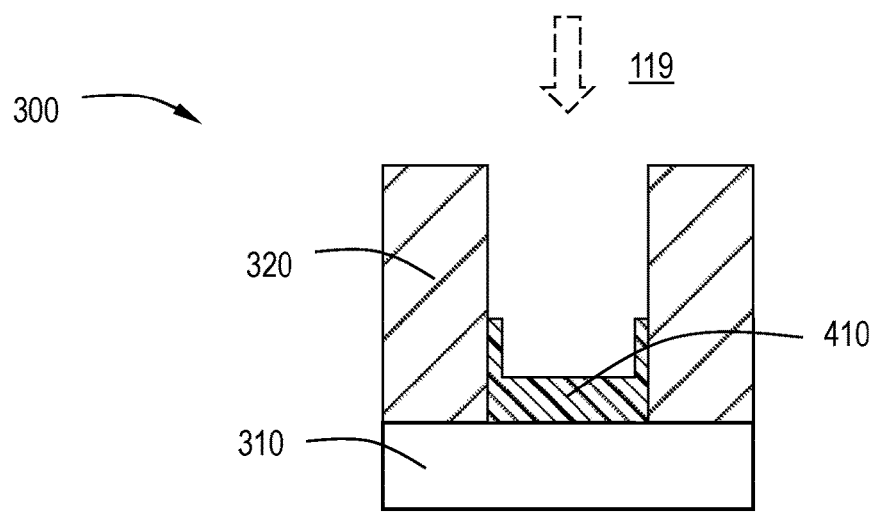
FIG. 8
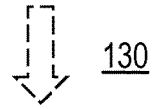

SELECTIVE METAL REMOVAL WITH FLOWABLE POLYMER

TECHNICAL FIELD

Embodiments of the present disclosure pertain to methods of metal removal facilitated by a flowable polymer. More particularly, embodiments of the disclosure are directed to methods of selectively removing tungsten relative to a flowable polymer within a substrate feature.

BACKGROUND

Gapfill process are integral to several semiconductor manufacturing processes. A gapfill process can be used to fill a gap (or feature) with an insulating or conducting material. For example, shallow trench isolation, inter-metal dielectric layers, passivation layers, dummy gate, are all typically implemented by gapfill processes.

As device geometries continue to shrink (e.g., critical dimensions <20 nm, <10 nm, and beyond) and thermal budgets are reduced, defect-free filling of spaces becomes increasingly difficult due to the limitations of conventional deposition processes.

Processes for selective tungsten fill have been implemented wherein tungsten can be selectively deposited on a tungsten seed layer. Unfortunately, these processes both require a minimum seed layer thickness. Known PVD processes can provide the necessary seed layer thickness, but the selective tungsten fill process will deposit tungsten material on any exposed seed layer.

Accordingly, there is a need for methods to remove unwanted tungsten deposition from field and sidewall surfaces in order to enable bottom up fill by selective deposition processes.

SUMMARY

One or more embodiments of the disclosure are directed to a method of selective metal removal. The method comprises forming a flowable polymer film on a substrate surface with at least one feature formed therein. The at least one feature has an opening at a top surface with an opening width, at least one sidewall and a bottom. The at least one feature extends a feature depth from the top surface to the bottom. The flowable polymer film is formed within the at least one feature and has a polymer depth less than or equal to the feature depth. At least a portion of a metal material is selectively removed from the top surface without substantially affecting any material beneath the polymer film.

Additional embodiments of the disclosure are directed to a method of selective tungsten removal. The method comprises depositing a tungsten material on a substrate surface with at least one feature formed therein. The at least one feature has an opening at a top surface with an opening width, at least one sidewall and a bottom. The at least one feature extends a feature depth from the top surface to the bottom. A flowable polymer film is formed within the at least one feature and has a polymer depth less than or equal to the feature depth. At least a portion of the tungsten material is selectively removed from the top surface without substantially affecting the tungsten material beneath the polymer film. The polymer film is removed to expose the tungsten material beneath the polymer film. The tungsten material is etched from the at least one sidewall. A second metal material is selectively deposited on the tungsten material.

BRIEF DESCRIPTION OF THE DRAWINGS

So that the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments The embodiments as described herein are illustrated by way of example and not limitation in the figures of the accompanying drawings in which like references indicate similar elements.

FIGS. 3-10 illustrate a cross-sectional view of a substrate during processing according to one or more embodiment.

DETAILED DESCRIPTION

Figure 1:
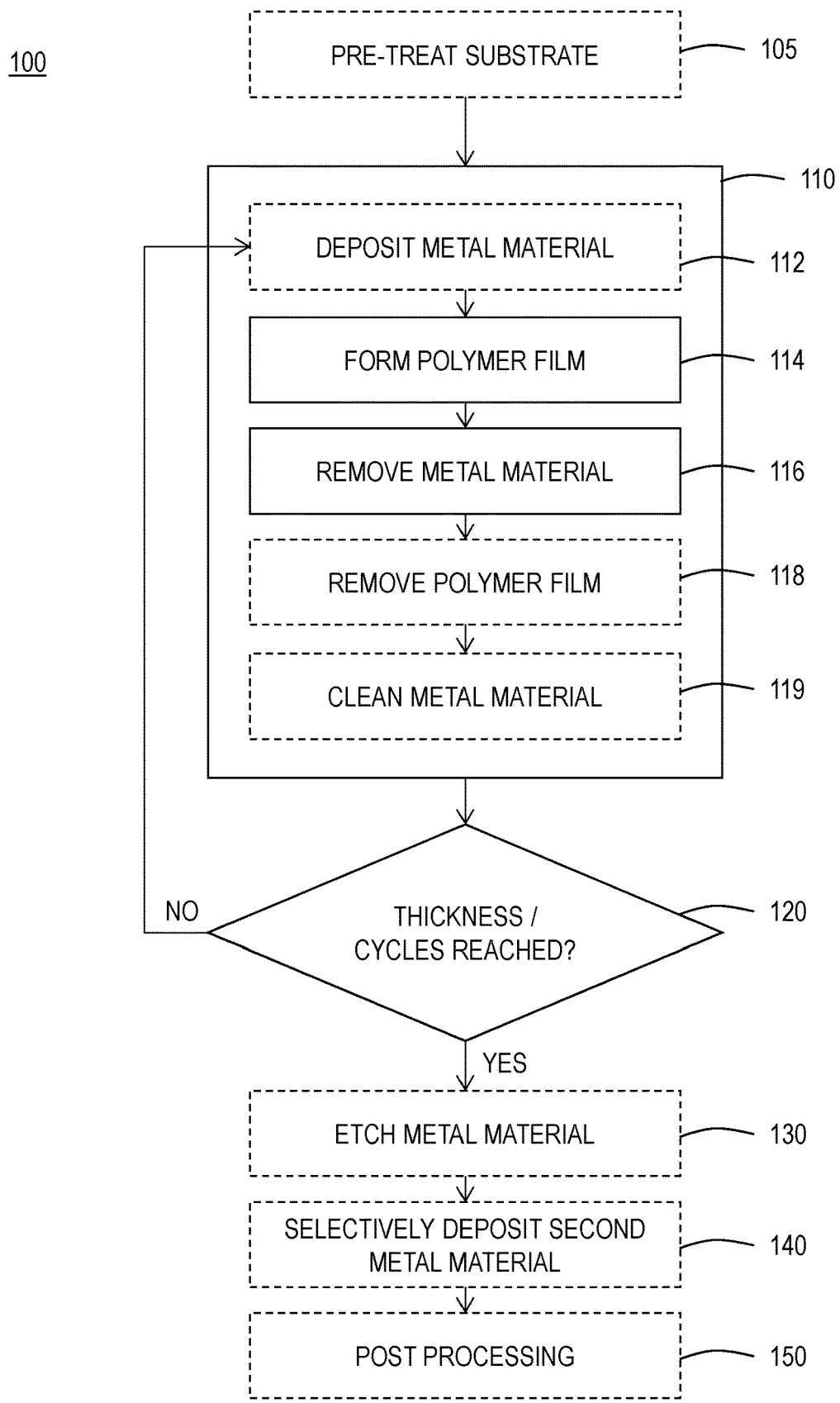
FIG. 1 illustrates a process flow diagram of a method according to one or more embodiment.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used herein, the term "substrate surface" refers to any substrate surface upon which a layer may be formed. The substrate surface may have one or more features formed therein, one or more layers formed thereon, and combinations thereof. The shape of the feature can be any suitable shape including, but not limited to, peaks, trenches, holes and vias (circular or polygonal). As used in this regard, the term "feature" refers to any intentional surface irregularity. Suitable examples of features include but are not limited to trenches, which have a top, two sidewalls and a bottom extending into the substrate, vias which have one or more sidewall extending into the substrate to a bottom and slot vias.

As used in this specification and the appended claims, the term "selectively" refers to process which acts on a first surface with a greater effect than another second surface. Such a process would be described as acting "selectively" on the first surface over the second surface. The term "over" used in this regard does not imply a physical orientation of one surface on top of another surface, rather a relationship of the thermodynamic or kinetic properties of the chemical reaction with one surface relative to the other surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

Embodiments of the disclosure advantageously provide methods for selectively removing a metallic material from a substrate surface. Some embodiments advantageously provide for the removal of a metallic material from the field and sidewalls of a feature without removal from the bottom surface of the substrate. Further embodiments advantageously provide methods of depositing an etch stop layer comprising a flowable organic polymer. Additional embodiments advantageously provide methods for forming metallic gapfill in a bottom-up fashion.

The embodiments of the disclosure are described by way of the Figures, which illustrate processes and substrates in accordance with one or more embodiments of the disclosure. The processes, schema and resulting substrates shown are merely illustrative of the disclosed processes, and the skilled artisan will recognize that the disclosed processes are not limited to the illustrated applications.

Figure 2:
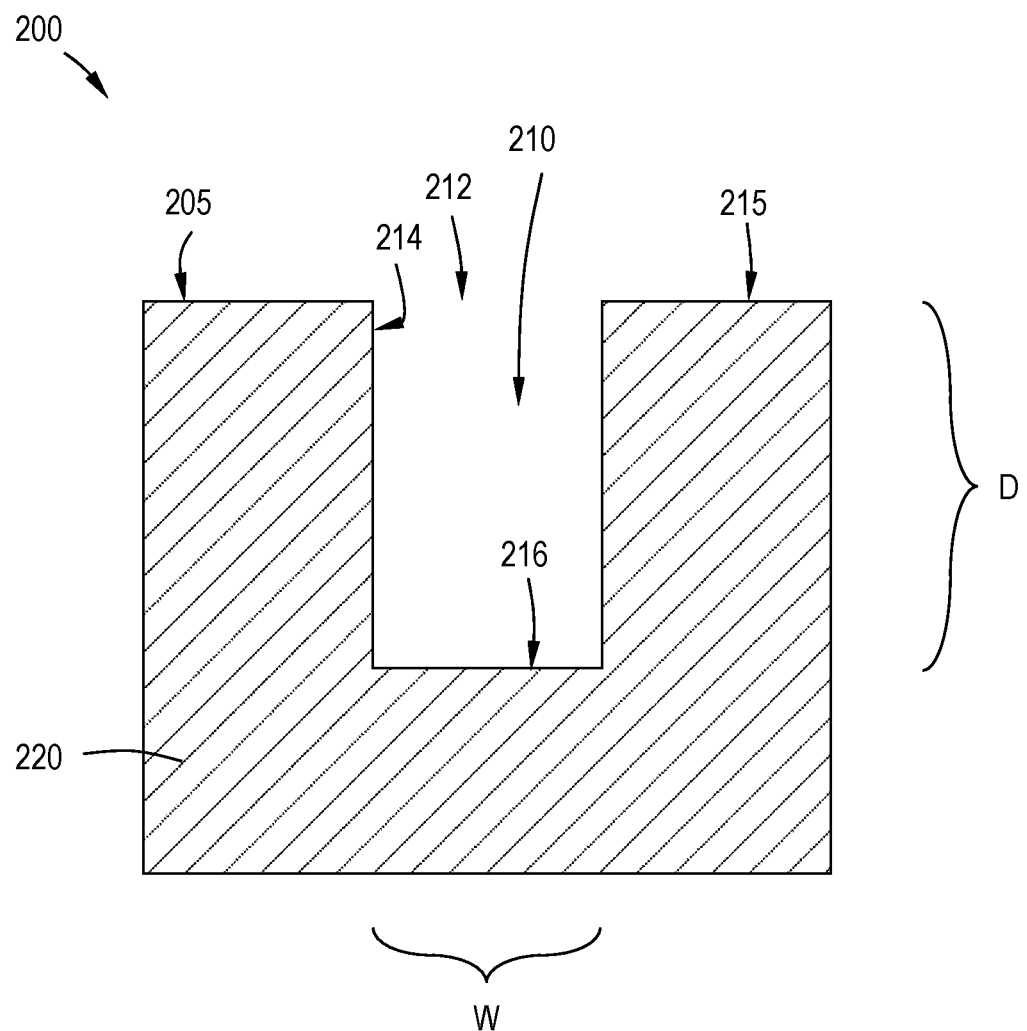
FIG. 2 illustrates a cross-sectional view of a substrate feature according to one or more embodiment.

Referring to the Figures, the disclosure relates to a method 100 of selective metal removal. FIG. 1 depicts a process flow diagram of a selective metal removal method 100 in accordance with one or more embodiment of the present disclosure. FIG. 2 depicts a substrate 200 having a substrate surface with at least one feature formed therein. FIGS. 3-10 depict a substrate during processing according to one or more embodiment of the present disclosure.

FIG. 2 illustrates a substrate 200 with a substrate surface 205. As identified above, the substrate surface refers to the exposed surface of the substrate upon which a process may be performed. The substrate surface 205 has at least one feature 210 formed therein. While only a single feature is shown in the Figures, one skilled in the art will recognize that a plurality of features will each be affected by the disclosed methods in a similar manner.

The at least one feature 210 has an opening 212 with an opening width W. The opening 212 is formed in a top surface 215 of the substrate 200. The feature 210 also has one or more sidewall 214 and extends a feature depth D from the top surface 215 to a bottom 216. While straight, vertical sidewalls are shown in the Figures, the disclosed methods may also be performed on slanted, irregular or reentrant sidewalls.

While the substrate 200 illustrated in FIG. 2 is comprised of a single material 220, those skilled in the art will recognize that the top surface 215, sidewall 214 and bottom 216 may each be comprised of one or more similar or different materials. For example, the lower portion of sidewall 214 may be formed from a first material while the upper portion of the same sidewall 214 may be comprised of a second material. Similarly, a thin layer may be deposited on the top surface 215 without forming an appreciable portion of the sidewall 214. Further, the bottom 216 may be comprised of a different material than the sidewall 214.

In some embodiments, the opening width W of the opening 212 is less than or equal to about 50 nm, less than or equal to about 30 nm, less than or equal to about 20 nm, less than or equal to about 10 nm, or less than or equal to about 7 nm. In some embodiments, the opening width W is in a range of about 8 nm to about 20 nm.

In some embodiments, the feature depth D of the feature 210 is greater than or equal to about 20 nm, greater than or equal to about 50 nm, greater than or equal to about 60 nm, greater than or equal to about 75 nm, or greater than or equal to about 90 nm. In some embodiments, the opening width W is in a range of about 60 nm to about 100 nm.

In some embodiments, the at least one feature 210 has an aspect ratio (D/W) in a range of about 1 to about 20 or in a range of about 2 to about 15.

For simplicity, reference will be made to parts of the feature 210 illustrated in FIG. 2 while referring to FIGS. 3-10. For example, the substrate 300 shown in FIG. 3 will be referred to as having a bottom 216. For clarity of the illustrations provided, the reference numerals of the parts of feature 210 are not shown in FIGS. 3-10.

Referring to FIGS. 1 and 3-10, in some embodiments, the method 100 begins with optional operation 105 to pre-treat the substrate. The pre-treatment at operation 105 can be any suitable pre-treatment known to the skilled artisan. Suitable pre-treatments include, but are not limited to, pre-heating, cleaning, soaking, native oxide removal, or deposition of an contact layers (e.g. titanium silicide (TiSi)), or capping layers (e.g., TiSiN). In some embodiments, a layer such as titanium silicide or TiSiN is deposited at operation 105.

An exemplary substrate 300 is shown in FIG. 3 after optional operation 105. The substrate 300 comprises a bottom formed from layer 310 and sidewalls and a top surface formed from layer 320. In some embodiments, layer 310 comprises a conductive material and layer 320 comprises a dielectric. Those skilled in the art will recognize that the disclosed processes may be performed on different materials and/or that the illustrated layers may be arranged in different ways.

The method 100 continues with cycle 110. Cycle 110 forms a layer of metal material 410 at the bottom 216 of at least one feature 210 of the substrate 300. Cycle 110 includes a series of operations which are each performed in sequence and may be repeated. Some of the operations are optional within each cycle. A given optional operation may be performed during each cycle, periodically (every other, every fifth or every hundredth cycle), as needed based on predetermined parameters, or even not at all.

As shown in FIG. 4, the cycle 110 begins with optional operation 112. At 112, a metal material 410 is deposited on the substrate surface 205 of the substrate 300. The metal material 410 has a bottom thickness on the bottom 216 and a top thickness on the top surface 215 and/or a sidewall thickness on the sidewall 214.

The metal material may be deposited by any suitable method. In some embodiments, the metal material 410 may be deposited by physical vapor deposition (PVD). In these embodiments, as shown in FIG. 4, the sidewall thickness is less than the top thickness and the bottom thickness. In some embodiments, the top thickness is greater than the bottom thickness.

Those skilled in the art will recognize that the disclosed methods may begin with a metal material 410 formed on the substrate surface 205 of the substrate 300. Accordingly, operation 112 is disclosed as optional.

The cycle 110 continues with operation 114. As shown in FIG. 5, at 114, a flowable polymer film 510 is formed within the feature 210 of the substrate 300. The polymer film 510 has a polymer depth less than or equal to the feature depth D. Stated differently, as a flowable film (described below), the polymer film is contained entirely with the feature 210 and is not present on the top surface 215 of the substrate 300. In some embodiments, the polymer film has a depth in a range of about 1 nm to about 10 nm, or in a range of about 2 nm to about 5 nm.

In the disclosed methods, processing parameters and reactants may be selected to limit conformality of deposited materials, which may allow the deposited material to better fill features on the substrate. A flowable material is one which, under the proper conditions will flow by gravity to the low point of a substrate surface and/or by capillary action to narrow CD spaces of trenches or other features.

In some embodiments, forming the polymer film comprises exposing the surface to one or more monomers. In some embodiments, the monomers consist essentially of a single, bi-functional monomer, each functional group being different. In this way, one functional group of a monomer molecule will react with the other functional group of a different monomer molecule. Those skilled in the art may recognize this as an "A" polymer.

In some embodiments, the one or more monomers comprise or consist essentially of methacrylate, styrene, benzyl alcohol, benzyl chloride or derivatives thereof. As used in this regard, a derivative of a base molecule may contain one or more group comprising 1-10 carbon atoms. For example, in some embodiments, the methacrylate compound has a general formula of:

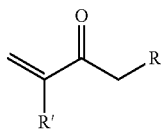

where R is a group comprising 1-10 carbon atoms and R' is a group comprising 1-6 carbon atoms. As used in this regard, a group comprising carbon atoms may be linear, branched, cyclic, saturated or unsaturated. The groups comprising carbon atoms disclosed herein do not contain groups which are reactive in the chemical polymerization process described herein.

Additionally, a styrene derivative monomer may include a group on the benzene ring with 0-10 carbon atoms and an R' group on the vinyl comprising 1-6 carbon atoms. A benzyl alcohol derivative monomer or a benzyl chloride derivative monomer may include a group on the benzene ring comprising 0-10 carbon atoms and a R' group on the benzyl carbon comprising 1-6 carbon atoms.

In some embodiments, the monomers consist essentially of two bifunctional monomers, each functional group being the same. In this way the functional groups of one monomer react with the functional groups of a second monomer. Those skilled in the art may recognize this as an "AB" polymer.

In some embodiments, the monomers comprise at least two amine, aldehyde, ketone, or alcohol groups. In some embodiments, the monomers have a general formula of X—R"—X, where X is a functional group selected from $NH_2$, NHR', O, OH, CHO, CR'O, COOH, or COOR', R' is a group comprising 1-6 carbon atoms, and R" is a group comprising 1-15 carbon atoms. In some embodiments, R' comprises 1-4 carbon atoms. In some embodiments, R" is an ethylene or propylene group. In specific embodiments, the monomers comprise terephthalic acid (TPA, $C_6H_4(COOH)_2$) and ethylene diamine ($C_2H_4(NH_2)_2$).

In some embodiments, the monomers include a monofunctional monomer. When combined with the above embodiments, those skilled in the art may recognize this as an "AC" or "ABC" polymer. Without being bound by theory, in these embodiments, it is believed that the monofunctional monomer acts as a terminal group and limits any further chain reactions.

In some embodiments, the monofunctional monomer comprises an amine, aldehyde, ketone, or alcohol group. In some embodiments, the monofunctional monomer has a general formula of RX, where R is a group comprising 1-10 carbon atoms, X is a functional group selected from $NH_2$, NHR', O, OH, or COOH, and R' is a group comprising 1-6 carbon atoms.

As stated previously, the polymer film 510 is flowable. In order to control the "flowability" of the resulting film, it has been found that it is necessary to control the size of the resulting oligomers.

Accordingly, in some embodiments, the formation of the polymer film 510 is performed on a substrate maintained at a temperature in a range of 0° C. to 400° C. In some embodiments, the substrate is maintained at a temperature greater than or equal to about 0° C., greater than or equal to about 30° C., greater than or equal to about 50° C., greater than or equal to about 100° C., greater than or equal to about 200° C., or greater than or equal to about 300° C. In some embodiments, the substrate is maintained at a temperature less than or equal to about 400° C., less than or equal to about 300° C., less than or equal to about 200° C., less than or equal to about 100° C., less than or equal to about 50° C., or less than or equal to about 30° C.

Further, other process parameters may be controlled during the formation of the polymer film 510. Examples of parameters which may be controlled include, but are not limited to: processing chamber pressure, monomer selections, the use of an inert diluent or carrier gas, partial pressures of monomers, pulse sequence of monomers, and pause periods to permit flow of the polymer material.

The cycle 110 continues with operation 116. As shown in FIG. 6, at 116, at least a portion of the metal material 410 is selectively removed. The metal material 410 is removed from the top surface 215 without substantially affecting any material beneath the polymer film. As used in this regard, a process which does not "substantially affect" material layers does not cause any decrease in volume, thickness or composition. One skilled in the art will recognize that the polymer film 510 is acting as an etch stop layer during the removal of a portion of the metal material 410.

In some embodiments, operation 116 also removes a portion of the metal material 410 from the sidewall 214. In some embodiments, any metal material 410 which is present on sidewall 214 below the upper surface of the polymer film 510 may remain intact without being removed.

In some embodiments, the selective removal of the metal material 410 is performed by exposing the substrate surface 205 of substrate 300 to $NF_3$ radicals. In some embodiments, the substrate is maintained at a temperature in a range of 80° C. to 110° C.

In some embodiments, the selective removal of metal material 410 is performed by a sequence of oxidizing metal material 410 and exposing the oxidized material to a metal halide to etch the oxidized material. In some embodiments, when the metal material comprises tungsten, the metal halide comprises $WCl_5$.

The cycle 110 continues with optional operation 118. As shown in FIG. 7, at 118, the polymer film 510 is removed to expose the metal material 410 beneath the polymer film 510. In some embodiments, the removal of the polymer film 510 leaves residue of the polymer film 510, shown as X on the surface of the metal material 410. In some embodiments, the removal of the polymer film 510 is complete and leaves no residues.

In some embodiments, the polymer film 510 is removed by exposing the substrate surface 205 of the substrate 300 to a $H_2$ plasma treatment. In some embodiments, the polymer film 510 is removed by exposure to an $O_2$ plasma. In some embodiments, the polymer film 510 is removed by exposure to a thermal $O_2$ environment at an elevated temperature.

The cycle 110 continues with optional operation 119. As shown in FIG. 8, at 119, the residue X, if present, is cleaned from the surface of the metal material 410. The cleaning process can be any suitable process which cleans the surface of the metal material. In some embodiments, the cleaning process does not oxidize the metal surface.

In some embodiments, at the end of cycle 110, the surface of the metal material 410 does not contain any contaminants or residues of the polymer layer 410. Specifically, In some embodiments, there are no carbon or oxygen residues on the surface of the metal material 410. In some embodiments, when the method 100 includes repeated cycles 110 (see below), there are no contaminants or residues between amounts of the metal material 410 deposited in subsequent cycles. In some embodiments, when the method 100 includes the deposition of a second metal material 1010 (see below), there are no contaminants or residues between the metal material 410 are the second metal material 1010.

In some embodiments, this is achieved by a removal process at operation 118 which leaves no residues or contaminants. In some embodiments, this is achieved by performing a clean process at operation 119. In some embodiments, the monomers are selected so as not to contain any oxygen atoms which may oxidize the surface of the metal material 410 during removal of the polymer layer 510.

The method 100 continues to decision point 120. At point 120, the substrate is evaluated to determine whether or not the metal material 410 has reached a predetermined thickness or a predetermined number of cycles 110 have been performed. If the conditions are met, the method 100 continues to operation 130. If the conditions are not met, the method 100 returns to the beginning of cycle 110 with operation 112. In those embodiments in which the cycle 110 is repeated to form additional material, those skilled in the art will appreciate that operation 112 is often performed to deposit the requisite additional metal material. In some embodiments, the predetermined thickness is in a range of about 2 nm to about 10 nm.

Figure 9:
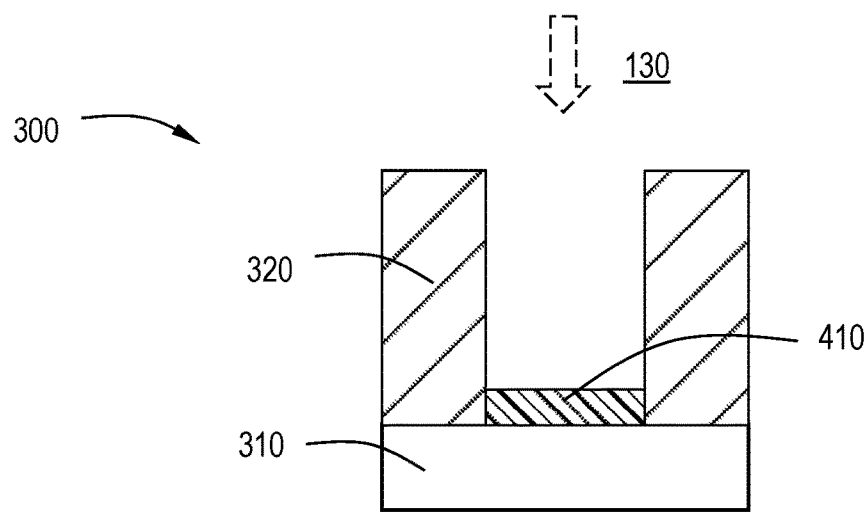

The method 100 continues with optional operation 130. As shown in FIG. 9, at 130, the metal material 410 is etched. In some embodiments, the metal material 410 is etch to remove the portions of the metal material 410 which extend up the sidewall 214. When etched, the metal material 410 is also thinned on the bottom 216 of the feature 210. Accordingly, one skilled in the art will recognize that the metal material 410 may be deposited to a greater bottom thickness than desired in a final product to provide for sacrificial material which will be removed when etching the metal material from the sidewall 214.

Without being bound by theory, the inventors have found that the removal of the sidewall portions of the metal material 410 simplifies the subsequent deposition of a second metal material 1010 at operation 140. The even, flat surface provided by operation 130 allows for the second metal material 1010 to grow in a bottom-up fashion without lateral growth from the sidewall 214.

Figure 10:
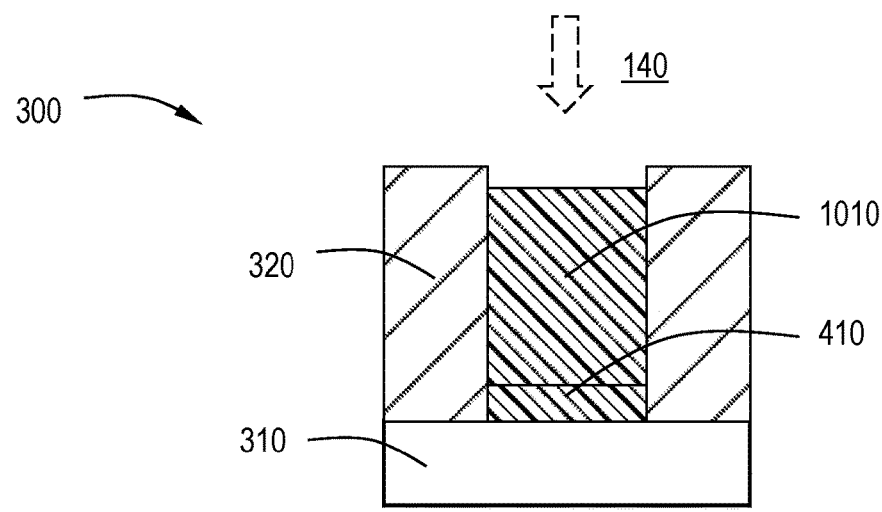

The method 100 continues at optional operation 140. As shown in FIG. 10, at 140, a second metal material 1010 is selectively deposited on the metal material 410. The deposition process is selective to the surface of the metal material 410 over other substrate surface materials (e.g. layer 320). The selective deposition process provides a gapfill material comprising the second metal material 1010 which is formed in a bottom-up fashion without lateral deposition from the sidewall 214. In some embodiments, the second metal material is deposited without forming any voids or seams within the second metal material 1010.

In some embodiments, the metal material 410 and the second metal material 1010 comprise the same metal. In some embodiments, the metal material 410 and the second metal material 1010 comprise different metals. In some embodiments, the first metal material comprises or consists essentially of tungsten, molybdenum, or ruthenium.

The method may end after operation 140 or it may continue with optional post processing at optional operation 150. The optional post-processing operation 150 can be, for example, a process to modify film properties (e.g., annealing or plasma treatment), a further film deposition process (e.g., additional ALD or CVD processes) to grow additional films, or a further etch process to form a desired predetermined device architecture. In some embodiments, the optional post-processing operation 150 can be a process that modifies a property of the deposited film. In some embodiments, the optional post-processing operation 150 comprises annealing the substrate 300. In some embodiments, annealing is performed at a temperature greater than or equal to about 300° C., greater than or equal to about 400° C., greater than or equal to about 500° C., greater than or equal to about 600° C., greater than or equal to about 700° C., greater than or equal to about 800° C., greater than or equal to about 900° C. or greater than or equal to about 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the substrate is annealed for a predetermined time in the range of about 15 seconds to about 90 minutes, or in the range of about 1 minute to about 60 minutes.

Figure 11:
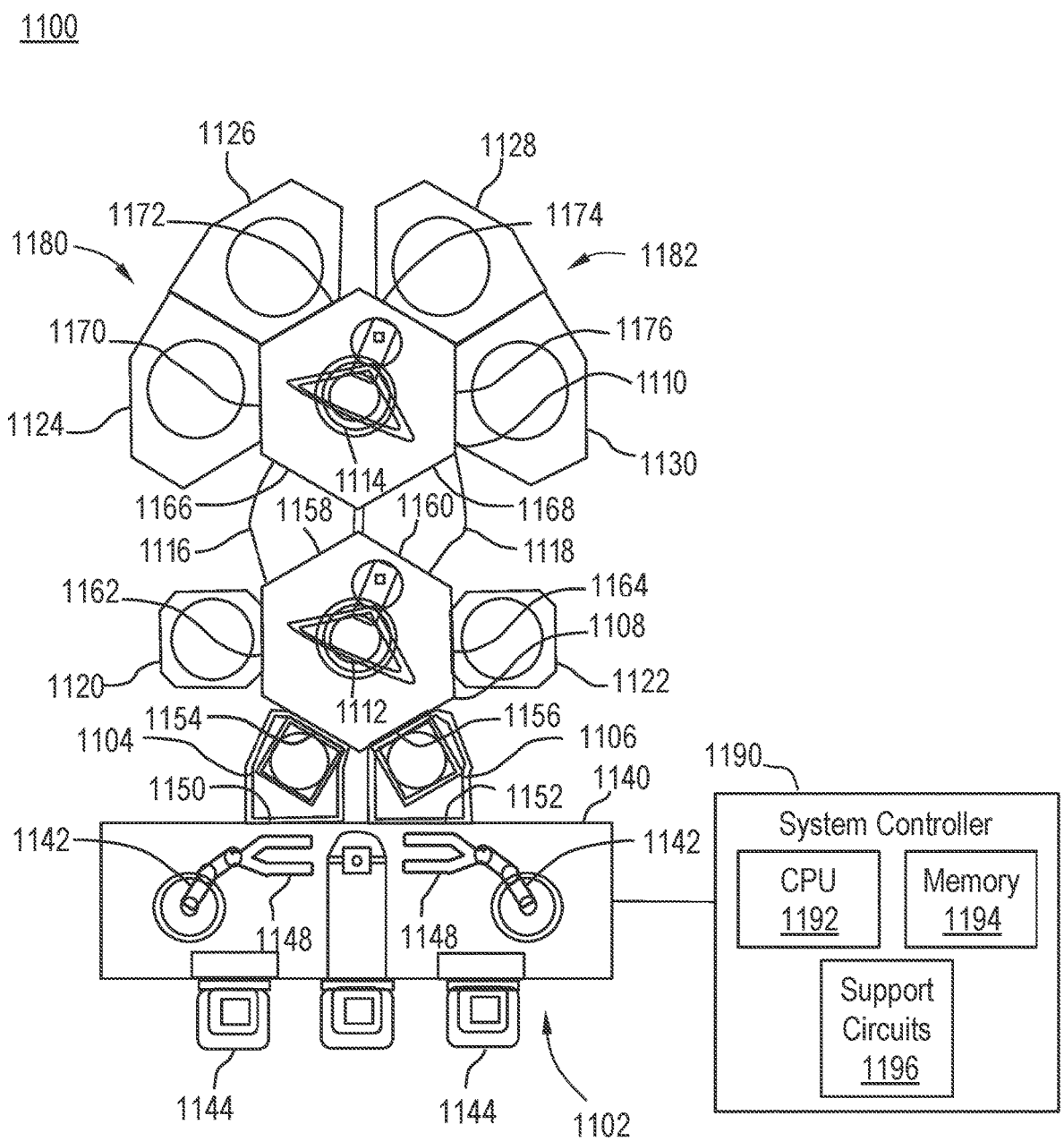
FIG. 11 is a schematic top-view diagram of an exemplary multi-chamber processing system according to one or more embodiment.

FIG. 11 is a schematic top-view diagram of an exemplary multi-chamber processing system 1100 according to embodiments of the present disclosure. The processing system 1100 generally includes a factory interface 1102, load lock chambers 1104, 1106, transfer chambers 1108, 1110 with respective transfer robots 1112, 1114, holding chambers 1116, 1118, and processing chambers 1120, 1122, 1124, 1126, 1128, 1130. As detailed herein, wafers in the processing system 1100 can be processed in and transferred between the various chambers without exposing the wafers to an ambient environment exterior to the processing system 1100 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 1100. Accordingly, the processing system 1100 may provide for an integrated solution for some processing of wafers.

Without being bound by theory, this integrated environment may aid in processing throughput and simplification of processing schema as capping layers to prevent oxidation or metals would no longer be necessary. In some embodiments, the disclosed methods are performed without breaking vacuum.

Examples of a processing system that may be suitably modified in accordance with the teachings provided herein include the Endura®, Producer®, or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 11, the factory interface 1102 includes a docking station 1140 and factory interface robots 1142 to facilitate transfer of wafers. The docking station 1140 is configured to accept one or more front opening unified pods (FOUPs) 1144. In some examples, each factory interface robot 1142 generally comprises a blade 1148 disposed on one end of the respective factory interface robot 1142 configured to transfer the wafers from the factory interface 1102 to the load lock chambers 1104, 1106.

The load lock chambers 1104, 1106 have respective ports 1150, 1152 coupled to the factory interface 1102 and respective ports 1154, 1156 coupled to the transfer chamber 1108. The transfer chamber 1108 further has respective ports 1158, 1160 coupled to the holding chambers 1116, 1118 and respective ports 1162, 1164 coupled to processing chambers 1120, 1122. Similarly, the transfer chamber 1110 has respective ports 1166, 1168 coupled to the holding chambers 1116, 1118 and respective ports 1170, 1172, 1174, 1176 coupled to processing chambers 1124, 1126, 1128, 1130. The ports 1154, 1156, 1158, 1160, 1162, 1164, 1166, 1168, 1170, 1172, 1174, 1176 can be, for example, slit valve openings with slit valves for passing wafers therethrough by the transfer robots 1112, 1114 and for providing a seal between respective chambers to prevent a gas from passing between the respective chambers. Generally, any port is open for transferring a wafer therethrough. Otherwise, the port is closed.

The load lock chambers 1104, 1106, transfer chambers 1108, 1110, holding chambers 1116, 1118, and processing chambers 1120, 1122, 1124, 1126, 1128, 1130 may be fluidly coupled to a gas and pressure control system (not specifically illustrated). The gas and pressure control system can include one or more gas pumps (e.g., turbo pumps, cryopumps, roughing pumps), gas sources, various valves, and conduits fluidly coupled to the various chambers. In operation, a factory interface robot 1142 transfers a wafer from a FOUP 1144 through a port 1150 or 1152 to a load lock chamber 1104 or 1106. The gas and pressure control system then pumps down the load lock chamber 1104 or 1106. The gas and pressure control system further maintains the transfer chambers 1108, 1110 and holding chambers 1116, 1118 with an interior low pressure or vacuum environment (which may include an inert gas). Hence, the pumping down of the load lock chamber 1104 or 1106 facilitates passing the wafer between, for example, the atmospheric environment of the factory interface 1102 and the low pressure or vacuum environment of the transfer chamber 1108.

With the wafer in the load lock chamber 1104 or 1106 that has been pumped down, the transfer robot 1112 transfers the wafer from the load lock chamber 1104 or 1106 into the transfer chamber 1108 through the port 1154 or 1156. The transfer robot 1112 is then capable of transferring the wafer to and/or between any of the processing chambers 1120, 1122 through the respective ports 1162, 1164 for processing and the holding chambers 1116, 1118 through the respective ports 1158, 1160 for holding to await further transfer. Similarly, the transfer robot 1114 is capable of accessing the wafer in the holding chamber 1116 or 1118 through the port 1166 or 1168 and is capable of transferring the wafer to and/or between any of the processing chambers 1124, 1126, 1128, 1130 through the respective ports 1170, 1172, 1174, 1176 for processing and the holding chambers 1116, 1118 through the respective ports 1166, 1168 for holding to await further transfer. The transfer and holding of the wafer within and among the various chambers can be in the low pressure or vacuum environment provided by the gas and pressure control system.

The processing chambers 1120, 1122, 1124, 1126, 1128, 1130 can be any appropriate chamber for processing a wafer according to the method 100. In some embodiments, the processing chamber 1120 can be capable of performing a pre-treatment process, the processing chambers 1122, 1124 can be capable of performing a deposition process, the processing chambers 1126, 1128 can be capable of performing etch processes, and processing chamber 1130 can be capable of performing a clean process. The processing chamber 1120 may be a SiCoNi™ Preclean chamber available from Applied Materials of Santa Clara, Calif. The processing chambers 1126, 1128 may be Selectra™ Etch chambers, MCxT chambers or Volta chambers, each available from Applied Materials of Santa Clara, Calif.

A system controller 1190 is coupled to the processing system 1100 for controlling the processing system 1100 or components thereof. For example, the system controller 1190 may control the operation of the processing system 1100 using a direct control of the chambers 1104, 1106, 1108, 1116, 1118, 1110, 1120, 1122, 1124, 1126, 1128, 1130 of the processing system 1100 or by controlling controllers associated with the chambers 1104, 1106, 1108, 1116, 1118, 1110, 1120, 1122, 1124, 1126, 1128, 1130. In operation, the system controller 1190 enables data collection and feedback from the respective chambers to coordinate performance of the processing system 1100.

The system controller 1190 generally includes a central processing unit (CPU) 1192, memory 1194, and support circuits 1196. The CPU 1192 may be one of any form of a general-purpose processor that can be used in an industrial setting. The memory 1194, or non-transitory computer-readable medium, is accessible by the CPU 1192 and may be one or more of memory such as random-access memory (RAM), read only memory (ROM), floppy disk, hard disk, or any other form of digital storage, local or remote. The support circuits 1196 are coupled to the CPU 1192 and may comprise cache, clock circuits, input/output subsystems, power supplies, and the like. The various methods disclosed herein may generally be implemented under the control of the CPU 1192 by the CPU 1192 executing computer instruction code stored in the memory 1194 (or in memory of a particular process chamber) as, for example, a software routine. When the computer instruction code is executed by the CPU 1192, the CPU 1192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 1108, 1110 and the holding chambers 1116, 1118. In other examples, more or fewer transfer chambers (e.g., one transfer chamber) and/or more or fewer holding chambers (e.g., no holding chambers) may be implemented as a transfer apparatus in a processing system.

Processes may generally be stored in the memory of the system controller 1190 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes a processing chamber to perform the operations of any of the methods (e.g., method 100) described herein. In one or more embodiments, the controller causes a processing chamber to perform the operations of method 100. In one or more embodiments, the controller causes the processing chamber to perform the operations of forming a polymer film on the substrate surface (operation 114). In one or more embodiments, the controller causes the processing chamber to perform the operations of removing the metal material (operation 116).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selective metal removal, the method comprising:
   forming a flowable polymer film on a substrate surface with at least one feature formed therein, the at least one feature having an opening at a top surface with an opening width, at least one sidewall and a bottom, the at least one feature extending a feature depth from the top surface to the bottom, the flowable polymer film formed within the at least one feature and having a polymer depth less than or equal to the feature depth;
   selectively removing at least a portion of a metal material from the top surface without substantially affecting any material beneath the polymer film; and
   removing the polymer film by exposing the substrate surface to a $H_2$ plasma treatment to expose a metal layer beneath the polymer film.

2. The method of claim 1, wherein forming a polymer film comprises exposing the substrate surface to one or more monomers.

3. The method of claim 2, wherein the monomers consist essentially of a single, bi-functional monomer.

4. The method of claim 2, wherein the monomers consist essentially of two bi-functional monomers.

5. The method of claim 2, wherein the monomers comprise a mono-functional terminal monomer.

6. The method of claim 1, wherein selectively removing the metal material is performed by exposing the substrate surface to $NF_3$ radicals.

7. The method of claim 1, further comprising:
depositing the metal material on the substrate surface before forming the polymer film, the metal material having a top thickness on the top surface and a bottom thickness on the bottom of the at least one feature.

8. The method of claim 7, wherein the metal material is deposited by physical vapor deposition (PVD) and the metal material has a sidewall thickness less than the top thickness and the bottom thickness.

9. The method of claim 1, further comprising:
selectively depositing a second metal material on the metal layer.

10. The method of claim 1, further comprising:
depositing the metal material on the substrate surface before forming the polymer film, the metal material having a top thickness on the top surface and a bottom thickness on the bottom of the at least one feature;
removing the polymer film to expose the metal material beneath the polymer film; and
repeating a cycle of depositing the metal material, forming the polymer film, selectively removing the metal material, and removing the polymer film to form a predetermined thickness of the metal material on the bottom of the at least one feature.

11. The method of claim 10, wherein the predetermined thickness is in a range of about 2 nm to about 10 nm.

12. The method of claim 10, wherein there is substantially no carbon or oxygen residue between layers of the metal material at the bottom of the at least one feature.

13. The method of claim 1, wherein the opening width is in a range of about 8 nm to about 20 nm.

14. The method of claim 1, wherein the feature depth is in a range of about 60 nm to about 100 nm.

15. The method of claim 1, wherein a ratio of the feature depth to the opening width is in a range of about 2 to about 15.

16. The method of claim 1, wherein the polymer depth is in a range of about 1 nm to about 10 nm.

17. The method of claim 1, wherein the metal material comprises one or more of tungsten, molybdenum, or ruthenium.

18. A method of selective metal removal, the method comprising:
forming a flowable polymer film on a substrate surface with at least one feature formed therein, the at least one feature having an opening at a top surface with an opening width, at least one sidewall and a bottom, the at least one feature extending a feature depth from the top surface to the bottom, the flowable polymer film formed within the at least one feature and having a polymer depth less than or equal to the feature depth; and
selectively removing at least a portion of a metal material from the top surface without substantially affecting any material beneath the polymer film by exposing the substrate surface to $NF_3$ radicals.

19. The method of claim 18, wherein forming a polymer film comprises exposing the substrate surface to one or more monomers.

20. The method of claim 19, wherein the monomers consist essentially of a single, bi-functional monomer.

21. The method of claim 19, wherein the monomers consist essentially of two bi-functional monomers.

22. The method of claim 19, wherein the monomers comprise a mono-functional terminal monomer.

23. A method of selective metal removal, the method comprising:
forming a flowable polymer film on a substrate surface with at least one feature formed therein, the at least one feature having an opening at a top surface with an opening width, at least one sidewall and a bottom, the at least one feature extending a feature depth from the top surface to the bottom, the flowable polymer film formed within the at least one feature and having a polymer depth less than or equal to the feature depth, the flowable polymer film formed by exposing the substrate surface to one or more monomers, the monomers (a) consisting essentially of a single, bi-functional monomer, (b) consisting essentially of two bi-functional monomers, or (c) comprise a mono-functional terminal monomer; and
selectively removing at least a portion of a metal material from the top surface without substantially affecting any material beneath the polymer film.

* * * * *